US006945054B1

(12) United States Patent
Norman

(10) Patent No.: US 6,945,054 B1
(45) Date of Patent: Sep. 20, 2005

(54) METHOD AND APPARATUS FOR COOLING MICROELECTRONIC COMPLEXES INCLUDING MULTIPLE DISCRETE FUNCTIONAL MODULES

(75) Inventor: Richard S. Norman, 1877 Poissant Road, Sutton, Quebec (CA) J0E 2K0

(73) Assignee: Richard S. Norman, Sutton (CA)

( * ) Notice: Subject to any disclaimer, the term of this patent is extended or adjusted under 35 U.S.C. 154(b) by 0 days.

(21) Appl. No.: 10/677,292

(22) Filed: Oct. 3, 2003

Related U.S. Application Data

(60) Provisional application No. 60/415,804, filed on Oct. 4, 2002.

(51) Int. Cl.[7] ............................................. F25B 21/02
(52) U.S. Cl. ............................. 62/3.2; 62/3.3; 62/3.7; 62/259.2; 165/104.33
(58) Field of Search ................. 62/259.2, 3.2, 62/3.3, 3.7; 165/80.4, 104.33; 361/385

(56) References Cited

U.S. PATENT DOCUMENTS

| | | | |
|---|---|---|---|
| 4,558,395 A | | 12/1985 | Yamada et al. |
| 4,729,424 A | * | 3/1988 | Mizuno et al. ............. 165/261 |
| 5,036,384 A | | 7/1991 | Umezawa |
| 5,051,865 A | * | 9/1991 | Kato .......................... 361/718 |
| 5,131,233 A | * | 7/1992 | Cray et al. ...................... 62/64 |
| 5,737,171 A | | 4/1998 | Buller et al. |
| 6,014,313 A | | 1/2000 | Hesselbom |
| 6,127,725 A | | 10/2000 | Harris |
| 6,176,299 B1 | | 1/2001 | Hanzlik et al. |
| 6,213,194 B1 | | 4/2001 | Chrysler et al. |
| 6,281,120 B1 | | 8/2001 | Strnad |

FOREIGN PATENT DOCUMENTS

| | | |
|---|---|---|
| EP | 0 820 098 A2 | 1/1998 |
| EP | 1 150 330 A2 | 10/2001 |
| JP | 61172358 A2 | 8/1986 |
| JP | 62072148 A | 4/1987 |
| JP | 2184061 A2 | 7/1990 |
| JP | 4250698 A2 | 9/1992 |
| JP | 2000299360 A2 | 10/2000 |

* cited by examiner

*Primary Examiner*—Melvin Jones

(57) ABSTRACT

A cooling device for cooling a microelectronic complex including a plurality of discrete functional modules. The cooling device includes a plurality of independent cooling modules, each cooling module in a thermal exchange relationship with a respective one of the plurality of discrete functional modules. During operation of the microelectronic complex, a cooling requirement of each discrete functional module is dynamically assessed, and the amount of cooling provided by each cooling module is adjusted on the basis of the assessed cooling requirements. Thus, the discrete functional modules are cooled independently from one another.

23 Claims, 7 Drawing Sheets

METHOD AND APPARATUS FOR COOLING MICROELECTRONIC COMPLEXES INCLUDING MULTIPLE DISCRETE FUNCTIONAL MODULES

CROSS-REFERENCE TO RELATED APPLICATION

The present application is based on U.S. provisional patent application No. 60/415,804, filed on Oct. 4, 2002, having the same inventor.

FIELD OF THE INVENTION

The invention relates to the field of microelectronic complexes, such as wafers or integrated circuits. More specifically, the invention is directed to a method and apparatus for cooling microelectronic complexes having multiple discrete functional modules.

BACKGROUND OF THE INVENTION

The evolution of integrated circuit (IC) fabrication technology has made possible the fabrication of microelectronic complexes, which perform a wide variety of functions and are characterized by varying degrees of complexity. Microelectronic complexes, that is systems and groups of discrete microelectronic functional modules, implement an important range of electronic devices, including microcomputers and microprocessors, and have important application in the design of electronic systems. Examples of such microelectronic complexes include semi-conductor wafers containing a plurality of chips or integrated circuits, as well as integrated circuits containing a plurality of microelectronic components.

In operation, a functional module of a microelectronic complex will heat up, and will require a certain amount of cooling in order to maintain acceptable operating conditions within the functional module and within the microelectronic complex. At the functional module level, cooling is required in order to prevent over-heating and subsequent malfunctioning or failure of, as well as possible damage to, the functional module. At the microelectronic complex level, cooling is required to minimize undesirable temperature differences between the functional modules, thus assuring an even temperature distribution across the microelectronic complex.

In the case of a semiconductor wafer including a plurality of integrated circuits, the discrete functional modules of the wafer are also referred to as cells. More specifically, a wafer is typically divided into a plurality of cells, each cell consisting of at least one integrated circuit. In operation, the different cells of the wafer may not all be operational at the same time, in which case the cells will not all heat up at the same time. Obviously, the cells that are in use will heat up more than the cells that are not in use, such that the cooling requirements for the wafer vary both as a function of time and location. A common problem in the field of semiconductor wafers is the creation of hot spots on the wafer where particular cells of the wafer generate an extreme amount of heat and do not receive adequate cooling. Such hot spots are characterized by excessive thermal expansion of the semiconductor material, and may lead to breakage in the semiconductor material.

One existing device for cooling microelectronic complexes is a temperature control structure, typically used to control the heating and cooling of specific regions of an integrated circuit chip. The temperature control structure includes multiple temperature control cells, formed on the chip surface by ion implanting N- and P-type dopant into adjacent regions, and then forming a metal bridge across similarly positioned ends of successive regions. A potential drop is applied across metal contacts of the cell, thus changing the temperature of the contacts relative to that of the electrically conducting bridge. Fabrication of arrays of temperature control cells of various shapes and sizes permits extremely precise heating and cooling of specific regions of the integrated circuit. Further, changing the type and/or concentration of conductivity-altering dopant present in a doped region, or changing the magnitude and/or polarity of the voltage drop across the metal contacts, will affect the character of the temperature control exerted.

Unfortunately, such a cooling device is quite complex and uses up an excessive amount of space on the body of the microelectronic complex, thus reducing the area available for processing elements. Further, the cooling device does not provide flexible control of the different temperature control cells during operation of the integrated circuit.

Another existing device is a cooling module including a plurality of cooling members, typically used to cool a plurality of integrated circuit chips mounted on a wiring substrate. Each cooling member is associated with a particular integrated circuit chip and is operative to cool that particular chip. Each cooling member has therein a space for circulating coolant, and is connected to neighboring cooling members by flexible pipes (bellows). The heat generated by an integrated circuit chip is conducted from the chip to its associated cooling member and cooled by the coolant circulating through the cooling member. The coolant circulates successively through cooling members arranged in the row or colum direction via the inter-connecting bellows.

Unfortunately, such a cooling module is inefficient in that cooling is provided to each integrated circuit chip successively, without discrimination or flexibility. Thus, cooling is provided to all of the integrated circuit chips, even those that are non-functional and not generating heat. Further, there is no differentiation in the amount of cooling provided to the integrated circuit chips on the basis of the specific cooling requirements of the chips.

Against this background, it clearly appears that a need exists in the industry for an improved method and apparatus for cooling microelectronic complexes.

SUMMARY OF THE INVENTION

According to a broad aspect, the invention provides a cooling device for a microelectronic complex including a plurality of discrete functional modules. The cooling device includes control logic and a plurality of independent cooling modules, where each cooling module is in a thermal exchange relationship with a respective one of the plurality of discrete functional modules. The control logic dynamically assesses a cooling requirement of each discrete functional module during operation of the microelectronic complex, and is operative to adjust an amount of cooling provided by each cooling module on the basis of the assessed cooling requirements.

For the purposes of the present application, the term "cooling requirement" broadly refers to any type of cooling needs that may characterize a discrete functional module. In one example, the cooling requirement of a particular cell is indicative of a specific amount of cooling to be applied by the associated cooling module to the particular cell. In another example, the cooling requirement of a particular cell is that the cooling level of the associated cooling module be increased or decreased. In yet another example, the cooling requirement of a particular cell is that the cooling operation of the respective cooling module be deactivated completely.

Advantageously, the cooling device of the present invention allows for the cooling operation to be dynamically varied over time and location during operation of the microelectronic complex, such that, at any point in time, certain discrete functional modules of the microelectronic complex are cooled while others are not. Additionally, of the discrete functional modules being cooled, certain discrete functional modules may be receiving a greater amount of cooling than other discrete functional modules. Thus, the cooling device can specifically and dynamically target those discrete functional modules that require the most cooling. Accordingly, the entire microelectronic complex can be generally maintained at the same predetermined optimum temperature, for ensuring good operating conditions.

In a specific example of implementation, the cooling device comprises a plurality of cooling modules in the form of thermo-electric coolers deposited on the body of the microelectronic complex, which is formed on a body of semiconductor material, such as silicon or germanium. Typically, each thermoelectric cooler is formed of doped semiconductor material that is characterized by a suitable gradient in dopant concentration extending from a region of relatively low doping density to a region of relatively high doping density. The region of relatively low doping density is located adjacent to the surface of the functional module to be cooled, while the region of relatively high doping density is located adjacent to a surface from which heat may be released. Heat is conducted through the thermo-electric cooler upon application of a suitable voltage between the region of low doping density and the region of high doping density. Typically, such heat is released to a heat sink or to any other suitable heat-dissipating device mounted adjacent to the microelectronic complex.

Each cooling module is capable to operate within a range of cooling levels, from a predetermined minimum cooling level to a predetermined maximum cooling level. Typically, at the minimum cooling level, the cooling module is inactive and provides no cooling to the respective functional module. The control logic is operative to dynamically control the cooling level of a particular cooling module on the basis of the assessed cooling requirement of the respective discrete functional module.

In one example, the control logic is distributed among the cooling modules of the cooling device, each cooling module including local control logic for setting the respective cooling module to the appropriate cooling level. Alternatively, distributed control logic may be implemented by including local control logic within each cell associated with a respective cooling module. In yet another alternative, the control logic may be implemented by a centralized control logic unit for the entire cooling device, serving all of the cooling modules.

In order to dynamically assess the cooling requirements of the discrete functional modules during operation of the microelectronic complex, the control logic of the cooling device may employ different algorithms.

In one example, the algorithm relies on signals utilized by the microelectronic complex in operation, where these signals are associated with respective ones of the plurality of discrete functional modules and contain information that allows the cooling requirement of the respective discrete functional module to be determined. Examples of such information include amounts of voltage or current entering the discrete functional modules, based on which the amount of heat generated by the discrete functional modules can be computed, as well as temperature values obtained from temperature sensors associated with the discrete functional modules. Thus, the control logic computes an amount of cooling required by a particular discrete functional module on the basis of the signal associated with the particular discrete functional module, and cools the particular discrete functional module accordingly.

In another example, the algorithm to assess the cooling requirement of a particular discrete functional module involves monitoring a temperature differential, or a heat generation differential from which may be calculated a power dissipation differential, between the particular discrete functional module and at least one other discrete functional module of the microelectronic complex. More specifically, taking the example of monitoring a temperature differential, the temperatures of the particular discrete functional module and the other discrete functional module are both tracked. When the temperature of the other discrete functional module is lower than the temperature of the particular discrete functional module, the particular discrete functional module is cooled such that its temperature substantially matches the temperature of the other discrete functional module. By applying this algorithm to all of the discrete functional modules of the microelectronic complex, substantially the same temperature will eventually be achieved across the entire microelectronic complex. The same concept applies to the monitoring of a power dissipation differential.

According to another broad aspect, the invention provides a method for cooling a microelectronic complex including a plurality of discrete functional modules. During operation of the microelectronic complex, a cooling requirement of each discrete functional module is dynamically assessed. The discrete functional modules are then cooled independently from one another on the basis of the assessed cooling requirements.

BRIEF DESCRIPTION OF THE DRAWINGS

These and other features of the present invention will become apparent from the following detailed description considered in connection with the accompanying drawings, of which.

Figure 1:
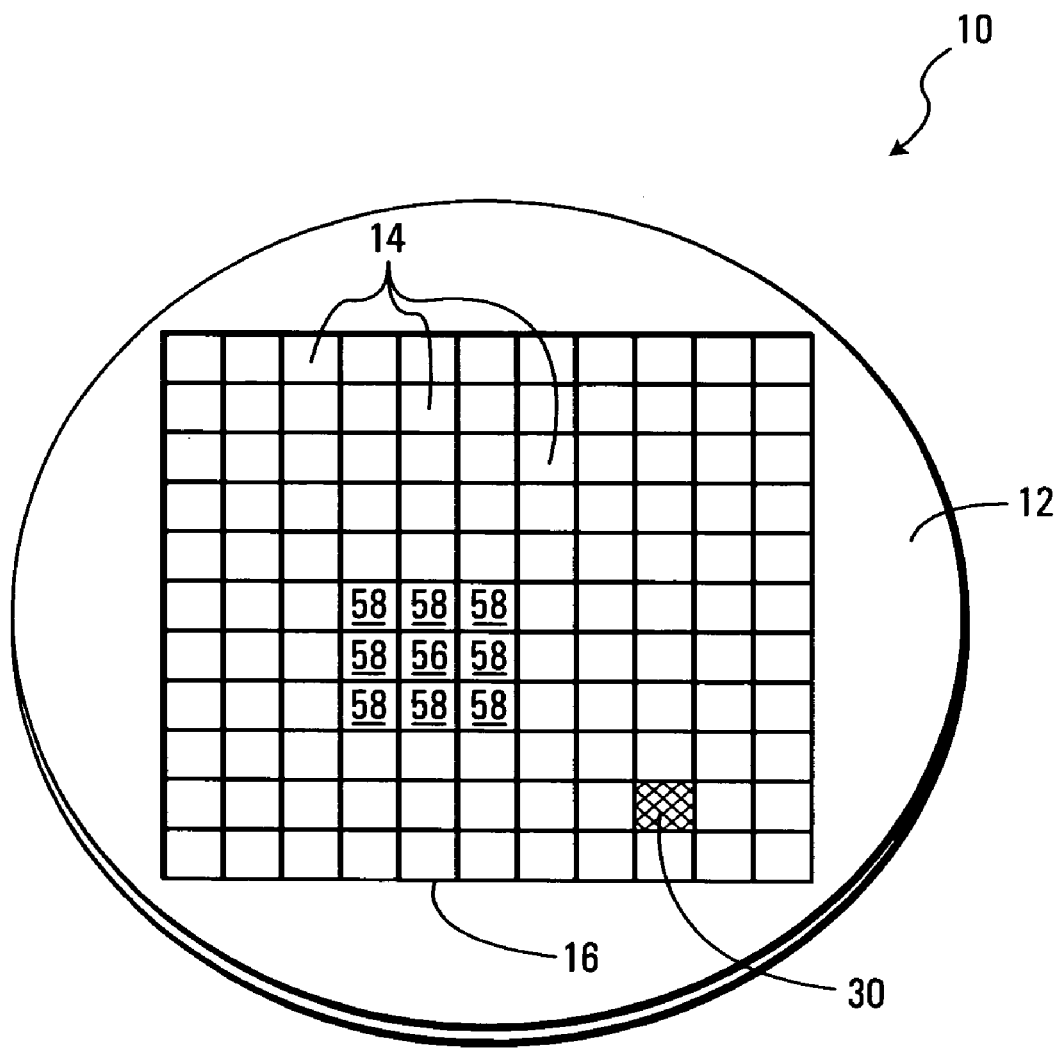
FIG. 1 is a perspective view of an example of a semiconductor wafer.

In the drawings, embodiments of the invention are illustrated by way of example. It is to be expressly understood, however, that the drawings are provided only for purposes of illustration and as an aid to understanding, and are not intended to be a definition of the limits of the invention, for which reference should be made to the appending claims.

DETAILED DESCRIPTION

FIG. 1 is a perspective view of a semi-conductor wafer 10, one example of a typical microelectronic complex. The wafer 10 is formed of a body of semi-conductor material 12 and contains a plurality of discrete functional modules 14, also referred to as cells. In this particular example of a microelectronic complex, each discrete functional module 14 includes at least one integrated circuit.

Note that in other examples of microelectronic complexes, such as the integrated circuit itself, the discrete functional modules of the microelectronic complex include the electronic components of the integrated circuit.

The wafer body of semi-conductor material 12 is made of any suitable material that has the requisite electrical conductivity and mechanical resistance, such as silicon, germanium or gallium arsenide, and may be of any size or shape. In the example of FIG. 1, the semi-conductor material of wafer body 12 is silicon, the body 12 characterized by a circular shape as a result of the cylindrical shape of the silicon crystal from which the wafer 10 was sliced. Typically, body 12 would be 10 to 30 cm in diameter and less than 1 mm thick.

The cells 14 of the wafer 10, which contain integrated circuits formed in the material of body 12, are dispersed within a dedicated area 16 of the body 12. The methods and techniques used to form integrated circuits in the material of body 12, such as oxidation, diffusion, ion implantation and chemical vapor deposition, have been well documented and are well known in the art. As such, these methods and techniques will not be described in further detail.

In the example of FIG. 1, the cells 14 are shown laid out within the dedicated area 16 in a structured array, each cell 14 being of the same size and occupying substantially the same amount of space. Alternatively, the cells 14 could be of different sizes, and occupy different amounts of space in a less regular pattern within the dedicated area 16.

Figure 2:
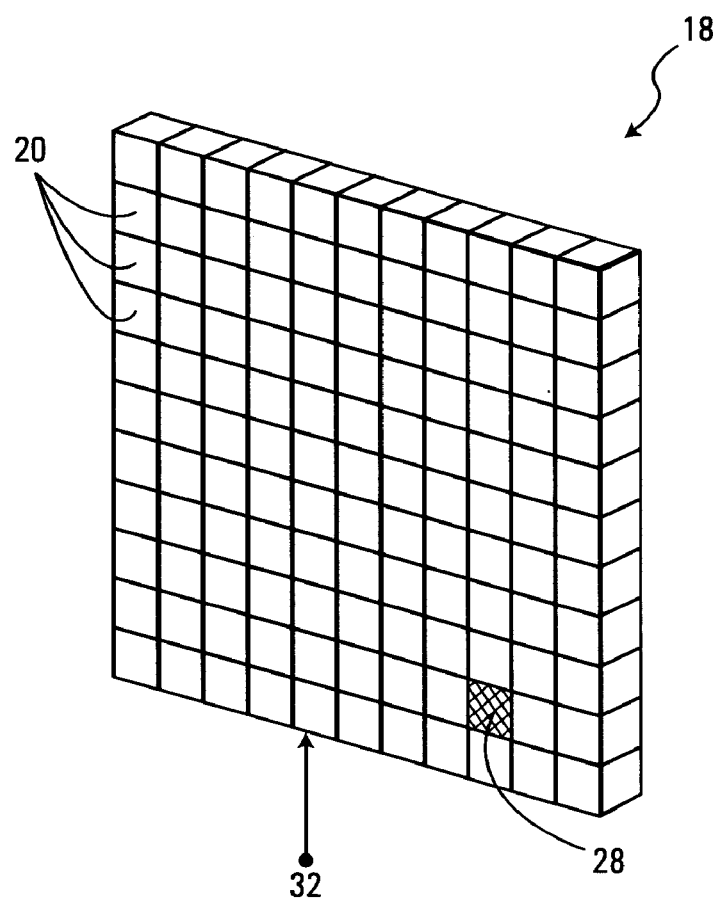
FIG. 2 illustrates a cooling device for the wafer shown in FIG. 1, according to an example of implementation of the present invention.

FIG. 2 illustrates a cooling device 18 for the wafer 10, constructed in accordance with a non-limiting example of implementation of the present invention. The cooling device 18 is formed of a plurality of independent cooling modules 20, laid out in a structured array designed to match the layout of the cells 14 on the body 12 of wafer 10. Although not shown, each cooling module 20 is provided with local control logic, which independently controls the operation of the respective cooling module 20, as will be described in further detail below.

The cooling device 18 receives power for operation from a power source 32, such as a current source or a voltage source, where this power is distributed to the cooling modules 20 as required during operation of the cooling device 18. Note that the power source 32 may provide a fixed amount of power for consumption by the cooling device 18, in which case the available power is divided among the cooling modules 20 that must perform cooling. Alternatively, each cooling module 20 may be provided with a respective power source, such that power need not be shared between the cooling modules 20.

Each cooling module 20 is associated with a respective cell 14 on the wafer 10, and in operation establishes a thermal exchange relationship with that respective cell 14. More specifically, in operation, a cooling module 20 is responsible for cooling down the associated cell 14, whether through absorption or dissipation of the heat generated by the cell 14, or a combination of both, among other possible cooling operations. Alternatively, each cooling module 20 may be associated with a plurality of cells 14 and, in operation, be responsible for cooling down the plurality of cells 14, or a portion of the area covered by the plurality of cells 14. The implementation and operation of cooling modules 20 will also be described in further detail below.

Figure 3:
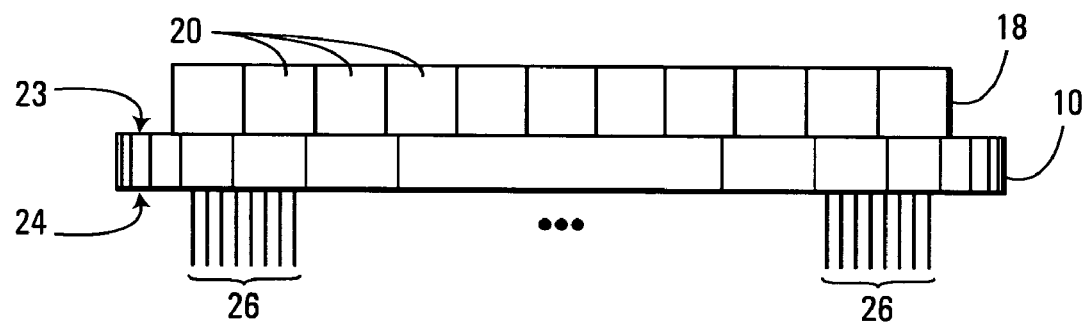
FIG. 3 is a side view of the cooling device of FIG. 2 connected to the wafer of FIG. 1.

FIG. 3 is a side view of the cooling device 18 connected to wafer 10.

As seen in FIG. 3, wafer 10 has first and second surfaces, the first surface 23 being shown in FIG. 1. On the second surface 24 of the wafer 10 are mounted a plurality of signal conducting members 26 for connection to an external substrate, such as a circuit board. Examples of signal conducting members include connectors, pins and wires, among other possibilities. These signal conducting members 26 are characterized by a high level of conductivity for transmitting signals between the discrete functional modules 14 of the wafer 10 and the external substrate, where such signals may include electrical and/or optical signals.

In use, the cooling device 18 contacts the first surface 23 of the wafer 10, such that each cooling module 20 is aligned with one of the cells 14 on the surface 23 of wafer 10. In this particular example of implementation, the surface area 28 (see FIG. 2) of each cooling module 20 is at least as great as the surface area 30 (see FIG. 1) of the associated cell 14. Alternatively, each cooling module 20 may be aligned with several cells 14 and/or portions of cells 14, in which case the surface area 28 of each cooling module is at least as great as the surface area 30 of the portion of the surface 23 of wafer 10 that includes the respective cells 14 and/or portions of cells 14.

In this non-limiting example of implementation, contact between the cooling device 18 and the first surface 23 of the wafer 10 arises as a result of a manufacturing process during which the material of the cooling device 18 is deposited onto the wafer 10, as will be discussed in further detail below.

Note that in alternative examples of implementation, the cooling modules 20 of cooling device 18 may be characterized by different shapes and occupy different amounts of space on the main body of the cooling device 18. Thus, the design of cooling device 18, more specifically the layout of cooling modules 20, may be customized to match any layout of discrete functional modules on the body of a microelectronic complex.

Each cooling module 20 of the cooling device 18 is capable to operate within a range of cooling levels, from a predetermined minimum cooling level to a predetermined maximum cooling level. Typically, at the minimum cooling level, the cooling module 20 is inactive and provides no cooling to the respective cell 14. The local control logic of each cooling module 20 is operative to dynamically assess a cooling requirement of the associated cell 14, and on this basis to independently control the operation of the respective cooling module 20. More specifically, during operation of the wafer 10, the local control logic of each cooling module 20 dynamically adjusts the cooling level of the respective cooling module 20, between the minimum and maximum cooling levels, on the basis of the assessed cooling requirement of the respective cell 14 of wafer 10.

Note that the term "cooling requirement" broadly refers to any type of cooling needs that may characterize a cell 14. In one example, the cooling requirement of a particular cell 14 is indicative of a specific amount of cooling to be applied by the associated cooling module 20 to the particular cell 14. In another example, the cooling requirement of a particular cell 14 is that the cooling level of the associated cooling module 20 be increased or decreased. In yet another example, the cooling requirement of a particular cell 14 is that the cooling operation of the respective cooling module 20 be deactivated completely.

Thus, the cooling operation of cooling device 18 is dynamically varied over time and location during operation of the wafer 10 such that, at any point in time, the specific cells 14 of the wafer 10 that require the most cooling are targeted by the respective cooling modules 20 of the cooling device 18. Consequently, a substantially even temperature distribution can be achieved across the entire surface 23 of the wafer 10.

Figure 4:
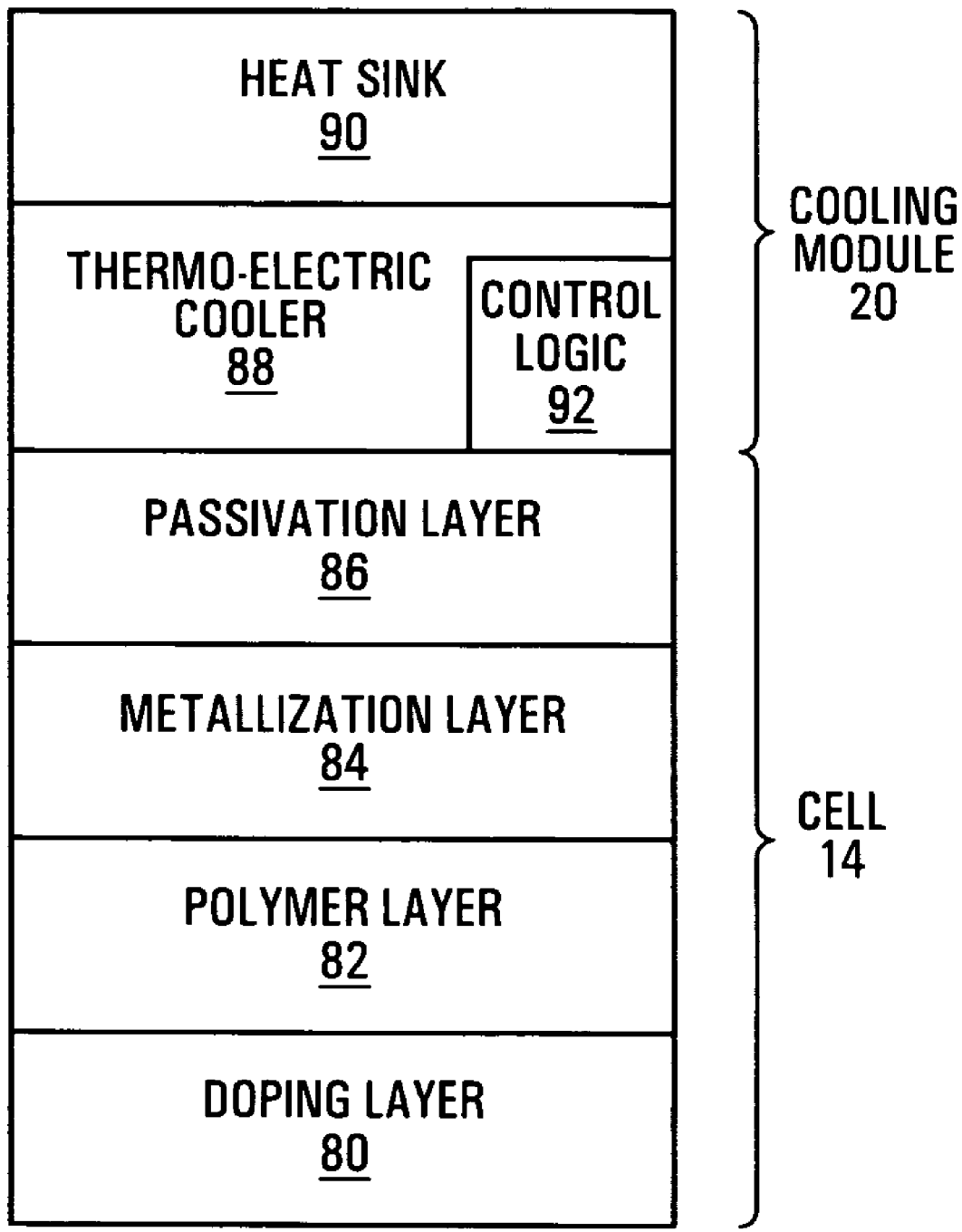
FIG. 4 is a structural block diagram of a cooling module of the cooling device shown in FIG. 2, according to an example of implementation of the present invention.

FIG. 4 illustrates the relationship between a cooling module 20 and a cell 14 of the wafer 10, in accordance with a non-limiting example of implementation of the present invention. As is well known in the art, each cell 14 of the wafer 10 is formed of a layer 80 of positively and negatively doped regions of semiconductor material. On top of this first layer 80, successive polymer 82, metallization 84 and passivation 86 layers are also formed. Methods for forming these layers on a wafer are well known in the art and will therefore not be described in further detail.

A thermo-electric cooler 88 is deposited on top of the passivation layer 86. In a specific example, well known in the art, the circuitry of the thermo-electric cooler 88 includes doped semiconductor material presenting a gradient in dopant concentration. The portion of the doped semiconductor material proximal to the passivation layer 86 presents a relatively low density of doping, while the portion of the doped semiconductor material distal to the passivation layer 86 presents a relatively high density of doping. When a suitable voltage is applied between the portions of high and low doping density, heat is carried from the portion of low doping density to the portion of high doping density. Typically, the heat is dissipated through a heat sink 90 or through any other suitable heat-dissipating device mounted adjacent to the wafer 10. Therefore, an amount of cooling provided by the cooling module 20 is regulated by controlling the amount of voltage applied between a surface of the thermo-electric cooler 88 contacting the passivation layer 86 of the cell 14 and a surface of the thermo-electric cooler 88 contacting the heat sink 90. Local control logic 92 is operative to set this amount of voltage on the basis of the cooling requirements of the cell 14, thereby controlling the cooling level of the thermo-electric cooler 88.

Note that control logic 92, which may consist of one or more integrated circuits or dedicated electronic components, is built into the circuitry of the thermo-electric cooler 88. Alternatively, this control logic 92 may be built into the circuitry of the cell 14.

Figure 5:
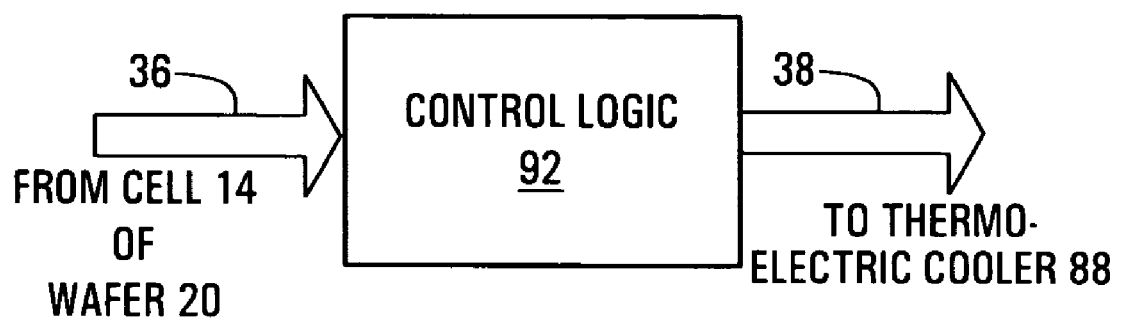
FIG. 5 is a functional block diagram of the control logic of the cooling module shown in FIG. 4.

As shown in FIG. 5, the local control logic 92 of each cooling module 20 receives external signals 36 from the associated cell 14 of the wafer 10, or from some other source, during operation of the wafer 10. By processing these external signals 36, the control logic 92 is able to dynamically assess a cooling requirement of the associated cell 14, on which basis the local control logic 92 generates one or more control signals 38 that control the operation, and thus the cooling level, of the respective cooling module 20. In the above example of circuitry of a thermoelectric cooler 88, the control signal(s) generated by the control logic 92 act to vary the amount of voltage applied between the portions of high and low doping density of the thermoelectric cooler 88.

The local control logic 92 of each cooling module 20 implements a cooling algorithm for dynamically assessing the cooling requirement of the respective cell 14, during operation of the wafer 10. This cooling algorithm relies on signals utilized by the respective cell 14 during operation, where each signal contains information that allows the cooling requirement of the respective cell 14 to be determined. Such signals may be electric or optical, among other possibilities, and include data signals, temperature signals as well as power signals, the latter including voltage and current signals.

Taking the example of data signals, each cell 14 of the wafer 10 generates and transmits to the respective cooling module 20 these data signals, which constitute the external signals 36 shown in FIG. 5. Each data signal includes a data message indicative of an increase or a decrease in the level of cooling required by the respective cell 14. The data signal may also include an indication of a specific amount of cooling required by the respective cell 14. The local control logic 92 processes these data signals and controls the cooling level of the respective cooling module 20 accordingly.

Taking the example of power signals, the local control logic 92 of a cooling module 20 may receive sensor measurement signals from one or more sensors integrated within the respective cell 14 for measuring a power signal, that is a voltage or current signal, entering the cell 14. It should be noted that the amount of heat generated by a particular cell 14 can be computed on the basis of the amount of voltage or current entering the particular cell 14. Such a computation is based on standard calculations well known in the field of microelectronic circuits, and will not be described in further detail. Thus, for each cell 14, a sensor continuously measures the designated power signal entering the cell 14 and periodically transmits sensor measurement signals to the control logic 92 of the respective cooling module 20. The local control logic 92 dynamically assesses the cooling requirement of the respective cell 14 on the basis of the sensor measurement signals, and adjusts the cooling level of the associated cooling module 20 in proportion to the computed amount of heat being generated by the respective cell 14.

In another example, a differential data or power signal is transmitted to the local control logic 92 of a particular cooling module 20, from dedicated sensors located on the wafer 10. In this example of implementation, information indicative of the differences between the operating conditions of the cell 14 associated with the particular cooling module 20 and the operating conditions of its adjacent cells 14 is transmitted to the control logic unit 22. In one possible scenario, sensors that operate on the basis of differential measurement principles (similar to those applied by Ground Faults Interrupt Circuit Breakers (GFICBs)) to measure differences in current entering adjacent cells 14 are used to generate and transmit differential power signals to the control logic unit 22. However, the reader skilled in the art will appreciate that many other implementations are possible.

Figure 6:
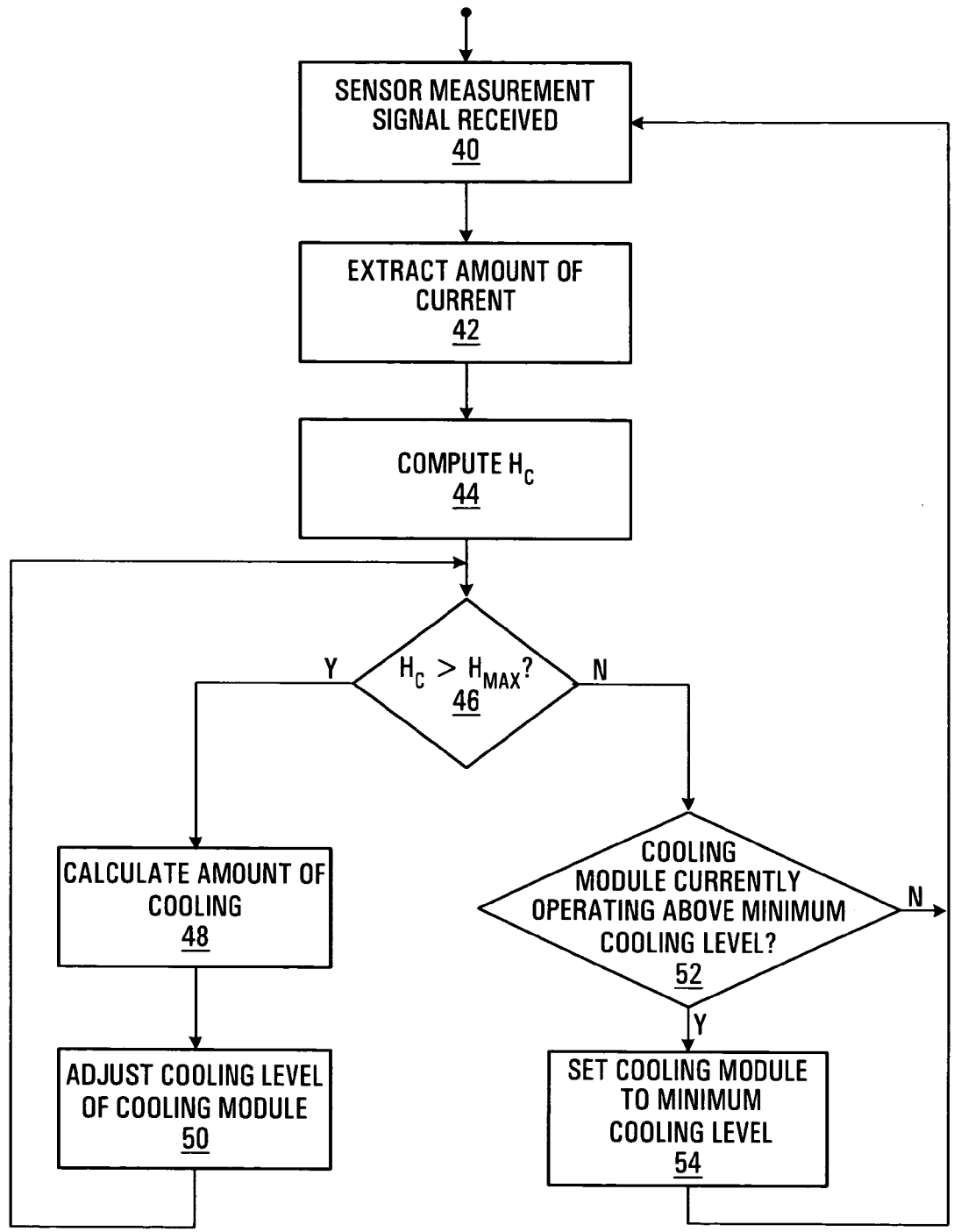
FIG. 6 is a flowchart illustrating a cooling algorithm implemented by the control logic depicted in FIG. 5, in accordance with an example of implementation of the present invention.

FIG. 6 provides a complete flowchart illustrating a non-limiting example of the cooling algorithm implemented by the control logic 92 of a particular cooling module 20 of the cooling device 18. Assume that, in this example, the cooling algorithm relies on power signals received from the respective cell 14. Although the algorithm may apply to each associated pair of cell 14 and cooling module 20, the cooling modules 10 being independently controlled in parallel, the following example will focus simply on one pair of cell 14 and cooling module 20, for the purpose of clarity.

At step 40, the control logic 92 receives a sensor measurement signal 36. At step 42, an indication of the amount of current entering the respective cell 14 is extracted from the sensor measurement signal. At step 44, the amount of heat generated by the cell 14 is computed (Hc) on the basis of the amount of current entering the cell 14. If the amount of heat generated by the cell 14, Hc, is greater than a maximum allowable amount of heat, Hmax, at step 46, an amount of cooling required by the cell 14 is calculated at step 48. At step 50, the cooling level of the respective cooling module 20 is adjusted to apply the required amount of cooling to the cell 14. If Hc is less than Hmax at step 46, and the cooling module 20 is currently operating above the minimum cooling level, the cooling module 20 is set to the minimum cooling level at step 54, which may result in complete deactivation of the cooling module 20. Since a sensor is continuously measuring the current entering the respective cell 14, and periodically sending sensor measurement signals to the cooling module 20, the assessment of the cooling requirement of the respective cell 14 is performed repeatedly, and the amount of cooling provided by the cooling module 20 to the respective cell 14 adjusted accordingly.

A similar cooling algorithm may be implemented by the control logic 92 when relying on temperature signals instead of power signals, since the amount of heat generated by a particular cell 14 can also be computed on the basis of the temperature of the particular cell 14.

Note that the control logic 92 of each cooling module 20 may implement different cooling algorithms in order to perform the dynamic assessment of the cooling requirements of the associated cell 14, during operation of the wafer 10.

In a variant example of implementation, the cooling algorithm for dynamically assessing the cooling requirement of a particular cell 14 during operation of the wafer 10 relies on current differentials measured from the different amounts of current entering neighboring cells 14 of the wafer 10. Thus, the current differential between the particular cell 14 and at least one other distinct cell 14 of the wafer 10 is the basis for determining whether the particular cell 14 requires cooling. More specifically, a current differential measurement sensor (similar in operation to a GFICB) tracks the current differential between the particular cell 14 and at least one other distinct cell 14. In a specific example of implementation, the local control logic 92 of the cooling module 20 associated with the particular cell 14 receives periodic updates of this current differential, with a period ranging from 0.1 microsecond to ten milliseconds. If the current entering the neighboring cell 14 is lower than the current entering the particular cell 14, the local control logic 92 is operative to adjust the cooling level of the respective cooling module 20 such that an amount of heat removed per unit time from the particular cell 14 is proportional to the current differential. If the local control logic of all of the cooling modules 20 of the cooling device 19 applies this same algorithm, substantially the same temperature will eventually be achieved across the entire wafer 10.

Figure 7:
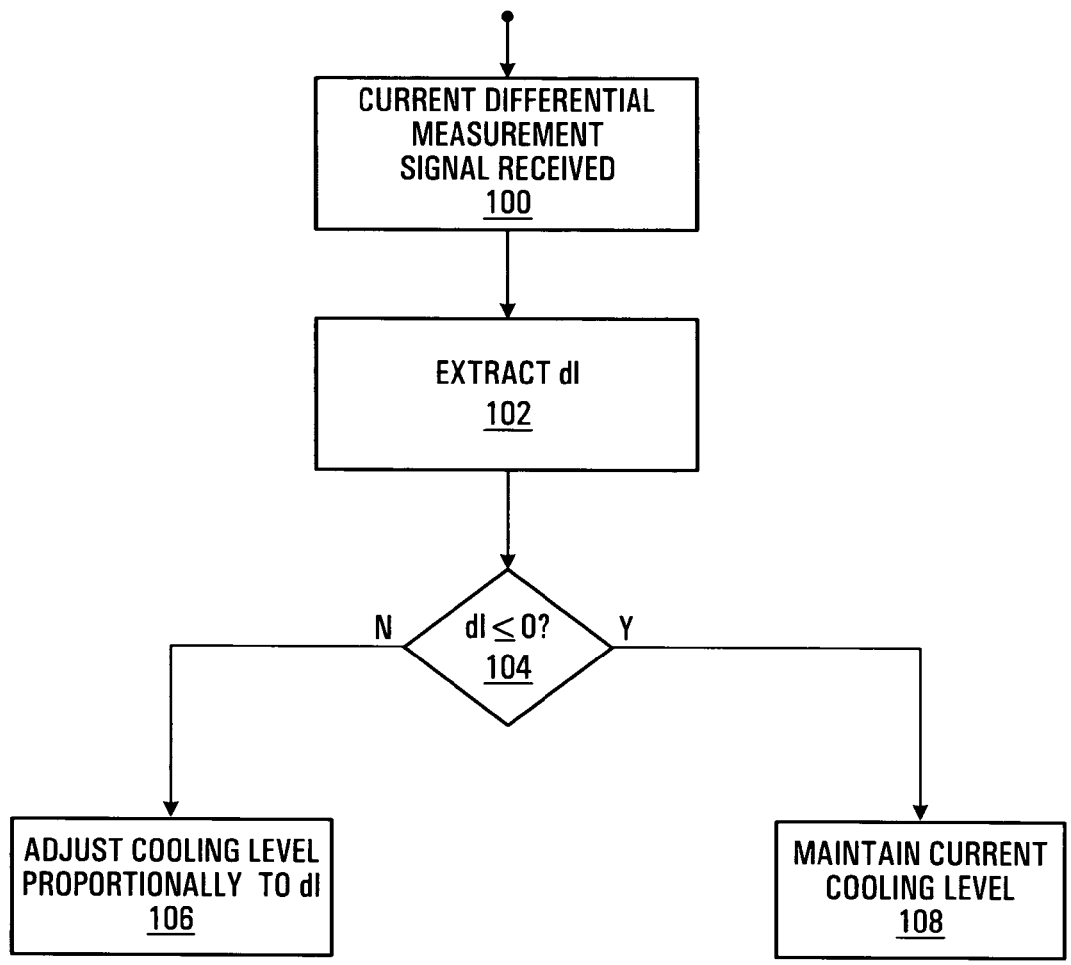
FIG. 7 is a flowchart illustrating a cooling algorithm implemented by the control logic unit in FIG. 5, in accordance with a different example of implementation of the present invention.

FIG. 7 provides a complete flowchart illustrating a variant example of the cooling algorithm implemented by the control logic 92 of a particular cooling module 20 of the cooling device 18. Assume that, in this example, the cooling algorithm relies on differential current measurements. Although the algorithm may apply to each associated pair of cell 14 and cooling module 20, the cooling modules 10 being independently controlled in parallel, the following example will focus simply on one pair of cell 14 and cooling module 20, for the purpose of clarity.

At step 100, the local control logic 92 of a particular cooling module 20 receives a current differential measurement signal 36 indicative of a differential in a current Ia entering the respective cell 14, hereinafter cell A, and a current Ib entering another cell 14, hereinafter cell B, located adjacent cell A. At step 102, the current differential measurement dI=Ia-Ib is extracted from the current differential measurement signal. If the value of dI is equal to or less than zero at step 104, cell A does not require additional cooling and the current cooling level of the particular cooling module 20, which may be at or above the minimum cooling level, is maintained at step 108. If the value of dI is greater than zero at step 104, cell A requires increased cooling. Accordingly, at step 106, the control logic 92 adjusts the cooling level of the particular cooling module in proportion to the identified dI, using a predetermined proportionality constant. The exact value of the proportionality constant depends on the specific implementation of the cooling module 20 and can be determined by the person skilled in the art using known methods.

Since the current differential measurement sensor is continuously measuring the current differential between cells A and B, and periodically sending sensor measurement signals to the particular cooling module 20, the assessment of the cooling requirement of cell A is performed repeatedly. Further, the cooling level for the particular cooling module 20 is adjusted accordingly.

In a further specific example, the cooling requirements of a particular cell 14 are assessed on the basis of temperature differentials measured between the particular cell 14 and the adjacent cells 14 on the wafer 10. With reference to FIG. 1, assume that the temperature differentials between cell 56 and the eight cells 58 located adjacent cell 56 are monitored and used to determine the cooling requirements of cell 56.

Under this example, the local control logic 92 of the cooling module 20 associated with cell 56 receives sensor measurement signals from temperature sensors integrated within the wafer 10, each sensor operative to continuously measure the temperature of a particular one of the cells 56, 58 and to periodically transmit sensor measurement signals to the local control logic 92 of the cooling module 20. On the basis of the received sensor measurement signals, the local control logic 92 computes temperature differentials between cell 56 and the cells 58, dynamically assesses the cooling requirements of the cell 56, and controls the operation of the respective cooling module 20 accordingly.

Figure 8:
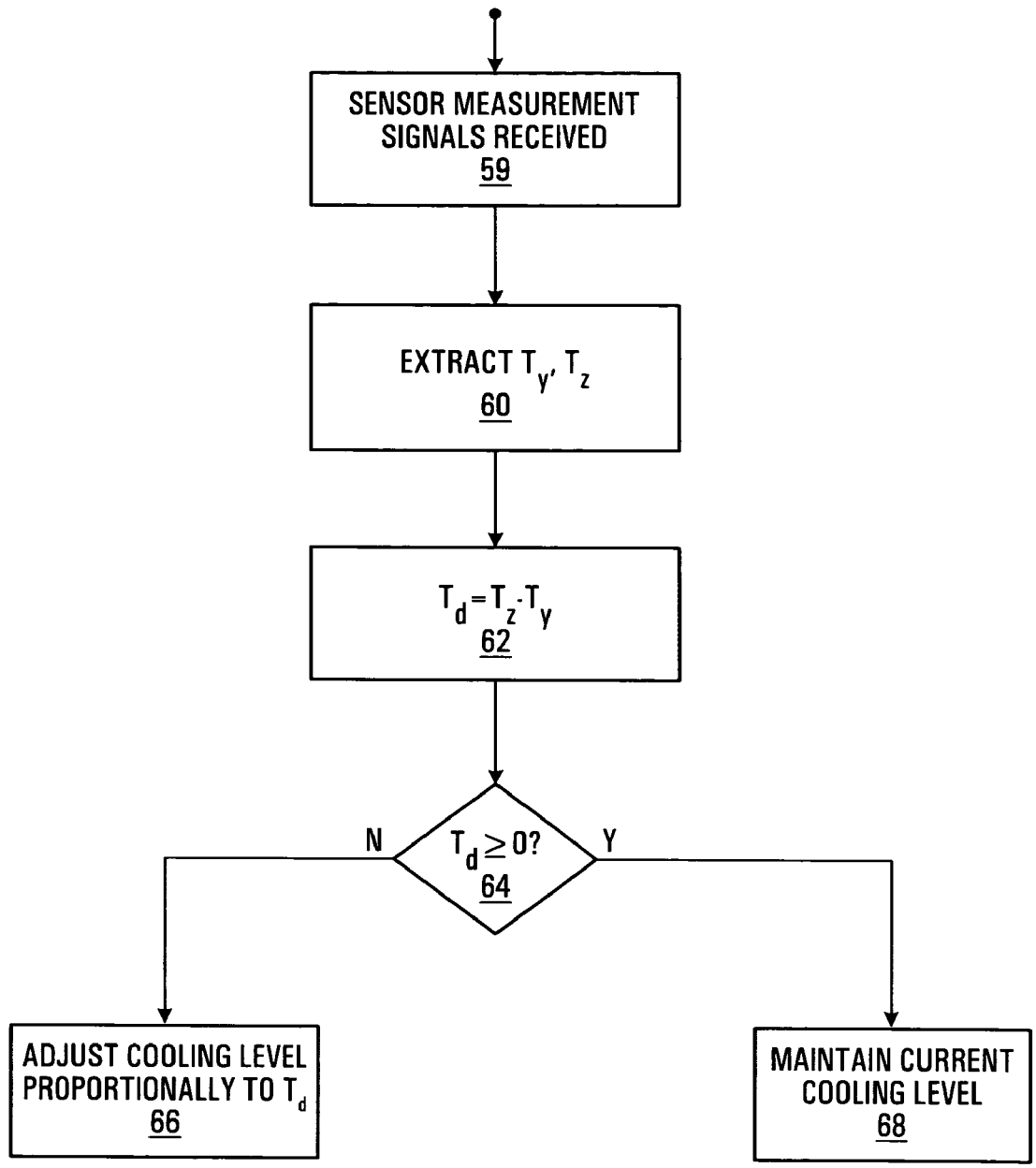
FIG. 8 is a flowchart illustrating a cooling algorithm implemented by the control logic unit in FIG. 5, in accordance with a further different example of implementation of the present invention.

FIG. 8 provides a complete flowchart illustrating a variant example of the cooling algorithm implemented by the control logic 92 of a particular cooling module 20 of the cooling device 18, in which case the cooling algorithm relies on differential temperature measurements between the associated cell 14 and its neighbouring cells 14. As in the case of the other algorithms described above, this algorithm also applies to each associated pair of cell 14 and cooling module 20.

At step 59, the local control logic 92 of a particular cooling module 20 receives a sensor measurement signal 36 indicative of the temperature Ty of the respective cell 14, hereinafter cell Y, as well as a sensor measurement signal indicative of the temperature Tz of another cell 14, hereinafter cell Z, located adjacent cell Y. At step 60, the temperature measurements Ty and Tz are extracted from the sensor measurement signals. At step 62, a temperature differential between cell Y and cell Z is computed as follows: Td=Tz−Ty. If the value of Td is equal to or greater than zero at step 64, cell Y does not require additional cooling and the current cooling level of the particular cooling module 20, which may be at or above the minimum cooling level, is maintained at step 68. If the value of Td is less than zero, cell Y requires increased cooling. Accordingly, at step 66, the control logic 92 adjusts the cooling level of the particular cooling module 20 in proportion to the identified Td, using a predetermined proportionality constant. The exact value of the proportionality constant depends on the specific implementation of the cooling module 20 and can be determined by the person skilled in the art using known methods.

Since temperature sensors are continuously measuring the temperatures of cells Y and Z, and periodically sending sensor measurement signals to the particular cooling module 20, the assessment of the cooling requirement of cell Y is performed repeatedly. Further, the cooling level for the particular cooling module 20 is adjusted accordingly.

Although several embodiments have been illustrated, this was for the purpose of describing, but not limiting, the invention. Various modifications will become apparent to those skilled in the art and are within the scope of this invention, which is defined more particularly by the attached claims.

What is claimed is:

1. A method for cooling a microelectronic complex including a plurality discrete functional modules formed on a unitary body of semiconductor material, said method comprising:
   a) during operation of the microelectronic complex, dynamically assessing a cooling requirement of each discrete functional module of the microelectronic complex formed on the unitary body of semiconductor material;
   b) cooling the discrete functional modules independently from one another on the basis of the cooling requirements assessed at step a).

2. A method as defined in claim 1, wherein in operation the microelectronic complex utilizes signals associated with respective ones of said plurality of discrete functional modules, each signal containing information allowing to determine the cooling requirement of the respective discrete functional module, said method including:
   c) computing an amount of cooling required by a particular discrete functional module on the basis of the signal associated with the particular discrete functional module;
   d) cooling the particular discrete functional module on the basis of the amount of cooling computed at step c).

3. A method as defined in claim 2, wherein computing an amount of cooling required by a particular discrete functional module includes determining an amount of heat generated by the particular discrete functional module.

4. A method as defined in claim 3, wherein said signals are electric signals.

5. A method as defined in claim 4, wherein said signals are voltage signals.

6. A method as defined in claim 4, wherein said signals are current signals.

7. A method as defined in claim 3, wherein said signals are optical signals.

8. A method as defined in claim 2, wherein computing the amount of cooling required by a particular discrete functional module includes determining a temperature of the particular discrete functional module.

9. A method as defined in claim 1, wherein assessing the cooling requirement of a particular discrete functional module includes monitoring a temperature differential between the particular discrete functional module and at least one other discrete functional module of said plurality of discrete functional modules.

10. A method as defined in claim 9, wherein monitoring the temperature differential between the particular discrete functional module and at least one other discrete functional module includes tracking the temperature of the at least one other discrete functional module.

11. A method as defined in claim 10, wherein cooling a particular discrete functional module includes adjusting the temperature of the particular discrete functional module to substantially match the tracked temperature of the at least one other discrete functional module.

12. A method as defined in claim 9, wherein the at least one other discrete functional module is adjacent the particular discrete functional module on said body of unitary semiconductor material.

13. A method as defined in claim 1, wherein assessing the cooling requirement of a particular discrete functional module includes monitoring a differential between an amount of heat generated by the particular discrete functional module and an amount of heat generated by at least one other discrete functional module of said plurality of discrete functional modules.

14. A method as defined in claim 13, wherein the differential between the amount of heat generated by the particular discrete functional module and the amount of heat generated by the at least one other discrete functional module of said plurality of discrete functional modules is assessed using a measurement of a differential between a current entering the particular discrete functional module and a current entering the at least one other discrete functional module.

15. A method as defined in claim 14, wherein the differential between the current entering the particular discrete functional module and the current entering the at least one other discrete functional module is assessed using a differential current measurement sensor connected between the particular discrete functional module and the at least one other discrete functional module.

16. A method as defined in claim 1, wherein cooling the discrete functional modules independently from one another includes the step of independently controlling cooling modules in a thermal exchange relationship with respective ones of the plurality of discrete functional modules.

17. A cooling device for a microelectronic complex including a plurality of discrete functional modules, said cooling device comprising:
   a) a plurality of independent cooling modules, each cooling module being adapted to establish a thermal exchange relationship with a respective one of the plurality of discrete functional modules;
   b) control logic for dynamically assessing a cooling requirement of each discrete functional module during operation of the microelectronic complex, said control logic operative to adjust an amount of cooling provided by each cooling module to the respective discrete functional module on a basis of the assessed cooling requirement of the respective discrete functional module wherein each cooling module is operable within a range of cooling levels, from a predetermined minimum cooling level to a predetermined maximum cooling level, said control logic being operative to dynamically adjust the cooling level of a particular cooling module on the basis of the assessed cooling requirement of the respective discrete functional module.

18. A cooling device as defined in claim 17, wherein the assessment includes the determination of an amount of cooling required by each discrete functional module.

19. A cooling device as defined in claim 17, wherein said control logic is distributed among the plurality of cooling modules, whereby each cooling module includes local control logic.

20. A cooling device as defined in claim 17, wherein said control logic is distributed among the plurality of discrete functional modules, whereby each discrete functional module includes local control logic.

21. A cooling device for a microelectronic complex including a plurality of discrete functional modules, said cooling device comprising:
   a) a plurality of independent cooling modules, each cooling module being adapted to establish a thermal exchange relationship with a respective one of the plurality of discrete functional modules;
   b) control logic for dynamically assessing a cooling requirement of each discrete functional module during operation of the microelectronic complex, said control logic operative to adjust an amount of cooling provided by each cooling module to the respective discrete functional module on a basis of the assessed cooling requirement of the respective discrete functional module wherein said control logic is centralized for the plurality of cooling modules, whereby said cooling device includes a single control logic unit for controlling the operation of said plurality of independent cooling modules.

22. A cooling device for a microelectronic complex including a plurality of discrete functional modules, said cooling device comprising:
   a) a plurality of independent cooling modules, each cooling module being adapted to establish a thermal exchange relationship with a respective one of the plurality of discrete functional modules, each cooling module being a thermoelectric cooler;
   b) control logic for dynamically assessing a cooling requirement of each discrete functional module during operation of the microelectronic complex, said control logic operative to adjust an amount of cooling provided by each cooling module to the respective discrete functional module on a basis of the assessed cooling requirement of the respective discrete functional module.

23. A cooling device for a microelectronic complex including a plurality of discrete functional modules, said cooling device comprising:
   a) a plurality of independent cooling modules, each cooling module being adapted to establish a thermal exchange relationship with a respective one of the plurality of discrete functional modules, each cooling module being a thermo-electric cooler;
   b) control logic for dynamically assessing a cooling requirement of each discrete functional module during operation of the microelectronic complex, said control logic operative to adjust an amount of cooling provided by each cooling module to the respective discrete functional module on a basis of the assessed cooling requirement of the respective discrete functional module;
   c) a plurality of current differential measurement sensors connected between adjacent discrete functional modules for assessing a current differential between the adjacent discrete functional modules.

* * * * *